United States Patent
Sano et al.

(10) Patent No.: US 11,756,918 B2
(45) Date of Patent: Sep. 12, 2023

(54) SEMICONDUCTOR DEVICE

(71) Applicant: KIOXIA CORPORATION, Tokyo (JP)

(72) Inventors: Tsutomu Sano, Yokohama Kanagawa (JP); Kazuya Maruyama, Higashikurume Tokyo (JP); Satoru Takaku, Yokohama Kanagawa (JP); Nobuhito Suzuya, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 373 days.

(21) Appl. No.: 17/184,511

(22) Filed: Feb. 24, 2021

(65) Prior Publication Data

US 2021/0288018 A1 Sep. 16, 2021

(30) Foreign Application Priority Data

Mar. 13, 2020 (JP) ................................. 2020-043946

(51) Int. Cl.
*H01L 25/065* (2023.01)
*H01L 23/00* (2006.01)

(52) U.S. Cl.
CPC .............. *H01L 24/46* (2013.01); *H01L 24/06* (2013.01); *H01L 25/0657* (2013.01); *H01L 2224/06515* (2013.01); *H01L 2224/46* (2013.01); *H01L 2225/0651* (2013.01); *H01L 2225/06506* (2013.01); *H01L 2225/06562* (2013.01); *H01L 2924/1435* (2013.01)

(58) Field of Classification Search
CPC .............. H01L 25/0657; H01L 25/117; H01L 2225/06562; H01L 2225/1011; H01L 2224/4917; H01L 2224/4809; H01L 2224/48147; H01L 2224/4813
See application file for complete search history.

(56) References Cited

U.S. PATENT DOCUMENTS

| | | |
|---|---|---|
| 6,157,688 A | 12/2000 | Tamura et al. |
| 7,755,175 B2 | 7/2010 | Ishida et al. |
| 7,973,404 B2 | 7/2011 | Nishimura et al. |

(Continued)

FOREIGN PATENT DOCUMENTS

| | | |
|---|---|---|
| JP | 2005085829 A | 3/2005 |
| JP | 2007134486 A | 5/2007 |

(Continued)

*Primary Examiner* — Tucker J Wright
(74) *Attorney, Agent, or Firm* — Kim & Stewart LLP

(57) ABSTRACT

A semiconductor device includes a first terminal, a second terminal, and a plurality of third terminals on a substrate. Memory chips are stacked on the substrate in an offset manner. Each memory chip has first pads, second pads, and third pads thereon. A first bonding wire is electrically connected to the first terminal and physically connected to a first pad of each memory chip. A second bonding wire is electrically connected to the second terminal and physically connected to a second pad of each memory chip. A third bonding wire electrically connects one third terminal to a third pad on each memory chip. A fourth bonding wire is connected to the first bonding wire at a first pad on a first memory chip of the stack and another first pad on the first memory chip. The fourth bonding wire straddles over the second bonding wire and the third bonding wire.

20 Claims, 5 Drawing Sheets

(56) References Cited

U.S. PATENT DOCUMENTS

| | | |
|---|---|---|
| 9,355,996 B2 | 5/2016 | Haba et al. |
| 9,704,797 B2 | 7/2017 | Lu et al. |
| 2015/0270210 A1* | 9/2015 | Nakayama .............. H01L 25/50 |
| | | 257/784 |

FOREIGN PATENT DOCUMENTS

| | | |
|---|---|---|
| JP | 4052697 B2 | 2/2008 |
| JP | 4707548 B2 | 6/2011 |
| JP | 2014513870 A | 6/2014 |
| TW | 201112384 A | 4/2011 |
| TW | 201440197 A | 10/2014 |

* cited by examiner

SEMICONDUCTOR DEVICE

CROSS-REFERENCE TO RELATED APPLICATION(S)

This application is based upon and claims the benefit of priority from Japanese Patent Application No. 2020-043946, filed Mar. 13, 2020, the entire contents of which are incorporated herein by reference.

FIELD

Embodiments described herein relate generally to a semiconductor device.

BACKGROUND

In a packaged semiconductor device in which NAND flash memory chips are stacked, there is a method of reducing an inductance and stabilizing an operation by running wirings for signals and a power supply in parallel in consideration of electrical characteristics. In order to further stabilize the operation, the power supply is strengthened by increasing the wirings of the power supply including a ground wiring and the like.

DETAILED DESCRIPTION

Figure 1:
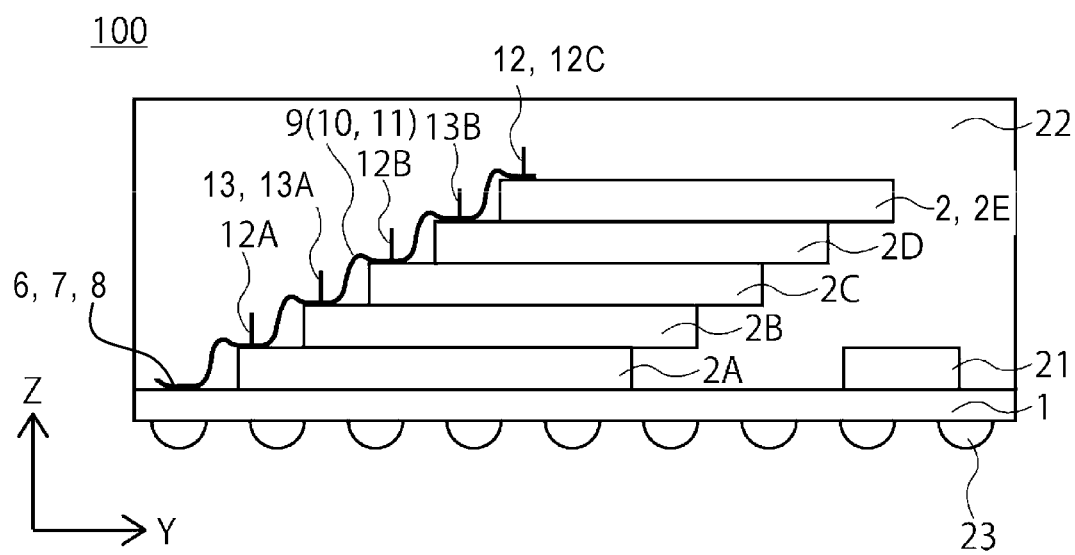
FIG. 1 is a schematic cross-sectional view of a semiconductor device according to an embodiment.

Embodiments provide a semiconductor device having improved electrical characteristics.

In general, according to one embodiment, a semiconductor device includes a first terminal on a substrate, a second terminal on the substrate, and a plurality of third terminals on the substrate. A plurality of memory chips is stacked on the substrate in an offset manner, each memory chip including first pads, second pads, and third pads thereon. A first bonding wire that is electrically connected to the first terminal and is physically connected to a first pad of different memory chips in the plurality. A second bonding wire that is electrically connected to the second terminal and is physically connected to a second pad of the different memory chips. A third bonding wire electrically connects one third terminal on the substrate to a third pad of the different memory chips. A fourth bonding wire is connected to the first bonding wire at a first pad on a first memory chip in the plurality and another first pad on the first memory chip. The fourth bonding wire straddles over (spans above without contacting) the second bonding wire connected to a second pad on the first memory chip and the third bonding wire connected to a third pad on the first memory chip.

Hereinafter, certain example embodiments will be described with reference to drawings.

The drawings are schematic, and depicted relationships between various dimensions, such thicknesses and planar dimensions, ratios of thicknesses each layer, or the like may differ from those in an actual device. Furthermore, there may be parts where the dimensional relationships and proportions differ between the drawings. In the drawings, some aspects or components may be omitted from the depictions to highlight other aspects or components for descriptive purposes.

First Embodiment

Figure 2:
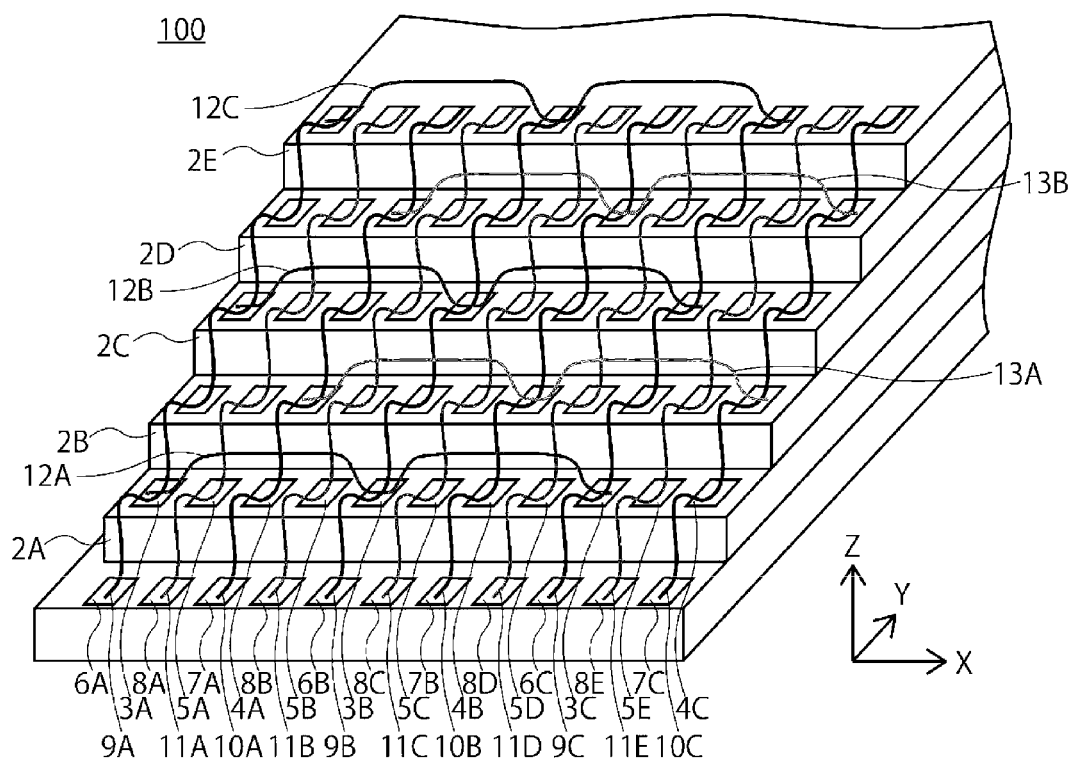
FIG. 2 is a perspective conceptual diagram of a semiconductor device according to an embodiment.

FIG. 1 shows a schematic cross-sectional view of a semiconductor device 100. FIG. 2 shows an enlarged perspective conceptual diagram of the semiconductor device 100. More specifically, the semiconductor device 100 according to the first embodiment is a packaged semiconductor device in which a NAND flash memory chip and the like are mounted. In the drawings and description, an X direction, a Y direction, and a Z direction that intersect with one another and are orthogonal to one another are utilized to describe relative arrangements between depicted components and the like.

The semiconductor device 100 is an example of a storage device. The semiconductor device 100 includes a substrate 1, semiconductor memory chips 2 (2A, 2B, 2C, 2D, 2E), first bonding wires 9 (9A, 9B, 9C), second bonding wires 10 (10A, 10B, 10C), third bonding wires 11 (11A, 11B, 11C, 11D, 11E), fourth bonding wires 12 (12A, 12B, 12C), fifth bonding wires 13 (13A, 13B), a controller chip 21, a sealing material 22, and solder balls 23.

The substrate 1 is a support substrate for the stacked semiconductor memory chips 2. The substrate 1 is, more specifically, a multilayer wiring substrate. The semiconductor memory chips 2 are provided on a first surface side of the substrate 1. A second surface side of the substrate 1 is provided with electrodes, such as the solder balls 23, for providing external connections for the semiconductor device 100.

The substrate 1 is electrically connected to the semiconductor memory chips 2 via bonding wires. The first surface side of the substrate 1 is provided with power supply pads 6 (6A, 6B, 6C) as "first terminals", power supply pads 7 (7A, 7B, 7C) as "second terminals", and signal pads 8 (8A, 8B, 8C, 8D, 8E) as "third terminals." The power supply pads 6, the power supply pads 7, and the signal pads 8 are arranged along the X direction and are connected to semiconductor memory chip 2 via bonding wires. The substrate 1 can be further provided with a pad (or pads) electrically connected to the underside of a semiconductor memory chip 2 or the like. The power supply pads 6 have a first reference potential. The power supply pads 7 have a second reference potential.

One or more semiconductor memory chips 2 are provided on the substrate 1. The semiconductor memory chips 2 are semiconductor chips that read and write data. As a nonvolatile memory chip, a NAND memory chip, a phase-change memory chip, a resistance-change memory chip, a ferroelectric memory chip, a magnetic memory chip, or the like may be used. As a volatile memory chip, a dynamic random access memory (DRAM) or the like may be used. When two or more semiconductor memory chips 2 are provided, it is preferable that the semiconductor memory chips 2 are semiconductor chips including the same circuit and the same structure except for individual differences. In the present embodiment, either a nonvolatile memory chip or a volatile memory chip may be used as a semiconductor memory chip 2.

As shown in FIG. 1, when the two or more semiconductor memory chips 2 are provided, the semiconductor memory chips 2 are preferably stacked in the Z direction while being offset from each other in the Y direction. When a plurality of semiconductor memory chips 2 are provided, for example, as shown in FIG. 1, the semiconductor memory chip 2A, the semiconductor memory chip 2B, the semiconductor memory chip 2C, the semiconductor memory chip 2D, and the semiconductor memory chip 2E are stacked in this order from a substrate 1 side.

The semiconductor memory chips 2 are preferably fixed to one another by an adhesive film or the like disposed between adjacent chips. The semiconductor memory chip 2A may similarly be attached to substrate 1 with an adhesive film.

The semiconductor memory chip 2A includes first power supply pads 3 (3A, 3B, 3C) as a plurality of "first pads", second power supply pads 4 (4A, 4B, 4C) as a plurality of "second pads", and a plurality of signal pads 5 (5A, 5B, 5C, 5D, 5E) as "third pads". The first power supply pads 3, the second power supply pads 4, and the signal pads 5 are arranged along the X direction. Although the semiconductor memory chip 2 may generally include pads other than the first power supply pad 3, the second power supply pads 4, and the signal pads 5, the description and an illustration will be omitted for purposes of descriptive clarity. The first power supply pads 3 (3A, 3B, 3C) in the semiconductor memory chips 2B, 2C, 2D, 2E and the first power supply pads 3 (3A, 3B, 3C) in the semiconductor chip 2A are in substantially same positions in the X direction, respectively, when viewed from the Z direction.

The second power supply pads 4 (4A, 4B, 4C) in the semiconductor memory chips 2B, 2C, 2D, 2E and the second power supply pads 4 (4A, 4B, 4C) in the semiconductor chip 2A are in substantially same positions in the X direction, respectively, when viewed from the Z direction.

The signal pads 5 (5A, 5B, 5C, 5D, 5E) in the semiconductor memory chips 2B, 2C, 2D, 2E and the signal pads 5 (5A, 5B, 5C, 5D, 5E) in the semiconductor chip 2A are in substantially same positions in the X direction, respectively, when viewed from the Z direction.

A voltage is applied to each semiconductor memory chip 2 via the first power supply pads 3 and the second power supply pads 4. The first reference potential applied to the first power supply pad 3 can be a negative potential, a ground potential, or a positive potential. The second reference potential applied to the second power supply pad 4 can be a negative potential, a ground potential, or a positive potential. The first power supply pad 3 is preferably connected to the ground wiring of the semiconductor memory chip 2 or the power supply wirings for driving various circuits of the semiconductor memory chip 2. The second power supply pad 4 is preferably connected to a power supply wiring when the first power supply pad 3 is connected to the ground wiring, and is preferably connected to the ground wiring when the first power supply pad 3 is connected to a power supply wiring. In the present example, there are three types of power supply voltages: Vcc, VccQ, and Vpp. These power supply voltages are applied to a power supply wiring. The power supply voltage Vcc is a circuit power supply voltage which is generally supplied from the outside as an operational power supply, and, for example, a voltage of approximately 3.3 V is input. A voltage of 1.2 V is input as the power supply voltage VccQ, for example. The power supply voltage VccQ is used when signals are transmitted and received from the semiconductor memory chip 2. The power supply voltage Vpp is a power supply voltage higher than the power supply voltage Vcc, and, for example, is a voltage of 12 V. The voltage Vss applied to the ground wiring is the ground potential, and is, for example, 0V. The signal pads 5 are preferably connected to a signal I/O wiring for the semiconductor memory chip 2.

The signal pads 5 are provided at any position between first power supply pads 3, between second power supply pads 4, or between a first power supply pad 3 and a second power supply pad 4. By arranging the power supply pads in a manner sandwiching the signal pad 5, an operating speed of the semiconductor device 100 can be improved. Although two signal pads 5 may be arranged in succession, in consideration of operation characteristics of the semiconductor device 100, it is preferable that at least one pad out of the pads adjacent to the signal pad 5 be a first power supply pad 3 or the second power supply pad 4.

The plurality of first bonding wires 9 (9A, 9B, 9C) extend in parallel with each other from the substrate 1 side toward pads of the plurality of first power supply pads 3, and electrically connect the substrate 1 and the plurality of first power supply pads 3. The first bonding wires 9 extend in the Y direction when viewed from the Z direction. In FIG. 2, the power supply pad 6A on the substrate 1 and the first power supply pad 3A of the semiconductor memory chip 2A are connected via the first bonding wire 9A. The power supply pad 6B and the first power supply pad 3B are connected via the first bonding wire 9B. The power supply pad 6C and the first power supply pad 3C are connected via the first bonding wire 9C.

In the semiconductor device 100 in FIG. 1, the first bonding wire 9A connects to the first power supply pads 3A of each of the semiconductor memory chips 2 (2A to 2E) stacked in five layers and the power supply pad 6A on the substrate 1. The first bonding wire 9B connects the first power supply pads 3B of each of the semiconductor memory chips 2 (2A to 2E) stacked in five layers and the power supply pad 6B on the substrate 1. The first bonding wire 9C connects the first power supply pads 3C of each of the semiconductor memory chips 2 (2A to 2E) stacked in five layers and the power supply pad 6C on the substrate 1.

The plurality of second bonding wires 10 (10A to 10C) extend in parallel with each other from the substrate 1 side toward pads of the plurality of second power supply pads 4, and electrically connect the substrate 1 and the plurality of second power supply pads 4. The second bonding wires 10 extend in the Y direction when viewed from the Z direction. In FIG. 1, the power supply pad 7A on the substrate 1 and the second power supply pad 4A of the semiconductor memory chip 2A are connected via the second bonding wire 10A. The power supply pad 7B and the second power supply pad 4B are connected via the second bonding wire 10B. The power supply pad 7C and the second power supply pad 4C are connected via the second bonding wire 10C.

In the semiconductor device 100 in FIG. 1, the second bonding wire 10A connects the second power supply pads 4A of each of the semiconductor memory chips 2 (2A to 2E) stacked in five layers and the power supply pad 7A on the substrate 1. The second bonding wire 10B connects the second power supply pads 4B of each of the semiconductor memory chips 2 (2A to 2E) stacked in five layers and the power supply pad 7B on the substrate 1. The second bonding wire 10C connects the second power supply pads 4C of each of the semiconductor memory chips 2 (2A to 2E) stacked in five layers and the power supply pad 7C on the substrate 1.

The plurality of third bonding wires 11 (11A to 11E) extend in parallel with each other from the substrate 1 side toward pads of the plurality of signal pads 5, and electrically connect the substrate 1 and the plurality of signal pads 5. The third bonding wires 11 extend in the Y direction when viewed from the Z direction. In FIG. 1, the signal pad 8A on the substrate 1 and the signal pad 5A of the semiconductor memory chip 2A are connected via the third bonding wire 11A. The signal pad 8B and the signal pads 5B are connected via the third bonding wire 11B. The signal pad 8C and the signal pads 5C are connected via the third bonding wire 11C. The signal pad 8D and the signal pads 5D are connected via the third bonding wire 11D. The signal pad 8E and the signal pads 5E are connected via the third bonding wire 11E.

The power supply pads 6 have the first reference potential. The power supply pads 7 have the second reference potential. The first reference potential of a power supply pad 6 is transferred to a first power supply pad 3 via a first bonding wire 9. The second reference potential of a power supply pad 7 is transferred to a second power supply pad 4 via a second bonding wire 10.

In the semiconductor device 100 in FIG. 1, the third bonding wire 11A connects the signal pads 5A of the semiconductor memory chips 2A to 2E and the power supply pad 8A on the substrate 1. The third bonding wire 11B connects the signal pads 5B of the semiconductor memory chips 2A to 2E and the power supply pad 8B on the substrate 1. The third bonding wire 11C connects the signal pads 5C of the semiconductor memory chips 2A to 2E and the power supply pad 8C on the substrate 1. The third bonding wire 11D connects the signal pads 5D of the semiconductor memory chips 2A to 2E and the power supply pad 8D on the substrate 1. The third bonding wire 11E connects the signal pads 5E of the semiconductor memory chips 2A to 2E and the power supply pad 8E on the substrate 1.

The details of the connection format is not limited to the form shown in FIG. 1, and the present disclosure also includes, for example, a form in which a rewiring layer is provided between the substrate and the semiconductor memory chips 2, and pads on the rewiring layer and the first power supply pads 3 (3A to 3C) of the semiconductor memory chip 2 are connected via the first bonding wires 9 (9A to 9C).

Furthermore, while the bonding wires 9, 10, and 11 are each depicted as being in parallel along the y-direction, there may be differences in extending angles of the various bonding wires 9, 10, and 11 depicted as arranged in parallel to the extent that the adjacent bonding wires do not short-circuit, for example, bonding wire extending angles may have various deviations within ±3°.

As a wiring length becomes longer, a power supply inductance is increased. When a plurality of semiconductor memory chips 2 are stacked, the wiring length necessarily becomes longer, and a Q value of a power supply impedance rises, which causes responsiveness deterioration. Therefore, it is preferable that the first bonding wires 9, the second bonding wires 10, and the third bonding wires 11 are connected to the pads without using bumps. By adopting wirings without bumps, the wiring lengths can be shortened.

Based on the above, the first bonding wires 9 are preferably continuous wires, that is wires that are not provided as discrete, separated segments at the plurality of first power supply pads 3 to be connected. Similarly, the second bonding wires 10 are preferably continuous wires that are not provided as discrete, separated segments on the plurality of second power supply pads 4 to be connected. Likewise, the third bonding wires 11 are preferably continuous wires that are not provided as discrete, separated segments on the plurality of signal pads 5 to be connected. Such a structure can be implemented by not using a ball bonding technique in which a first end of a ball-shaped molten bonding wire is bonded to a pad, but rather by wedge bonding. In wedge bonding, the wire is crimped to a pad electrode thereby bonding the first end of the wire to a pad without melting the first end. When a continuous wire is serial connected to a plurality of pads by wedge bonding, the joint part at pad has a flat shape. Since the wire after the wedge bonding can be further connected by the wedge bonding or the ball bonding to another wire (e.g., the fourth bonding wires 12 (12A, 12B, 12C) and the fifth bonding wires 13 (13A, 13B)), the first bonding wires 9 and the second bonding wires 10 are preferably wedge bonded. Similarly, the fourth bonding wires 12 and the fifth bonding wires 13 are preferably bonding wires formed by the wedge bonding.

By adopting wiring without using balls (bumps), the first bonding wire 9 and the first power supply pads 3 are directly connected, and the second bonding wire 10 and the second power supply pads 4 are directly connected, and the third bonding wire 11 and the signal pads 5 are directly connected. Since the balls do not intervene between the bonding wire and the pads, the wiring length can be shortened.

The fourth bonding wire 12A connects the first power supply pad 3A, the first power supply pad 3B, and the first power supply pad 3C in the semiconductor chip 2A to one another. The fourth bonding wire 12B connects the first power supply pad 3A, the first power supply pad 3B, and the first power supply pad 3C in the semiconductor chip 2C to one another. The fourth bonding wire 12C connects the first power supply pad 3A, the first power supply pad 3B, and the first power supply pad 3C in the semiconductor chip 2E to one another. The fourth bonding wires 12 straddle over second bonding wires 10 and third bonding wires 11 but is connected to first bonding wires 9 at a first power supply pad 3, and thereby can reduce an inductance of the first reference potential.

The fifth bonding wire 13A connects the second power supply pad 4A, the second power supply pad 4B, and the second power supply pad 4C in the semiconductor chip 2B to one another. The fifth bonding wire 13B connects the second power supply pad 4A, the second power supply pad 4B, and the second power supply pad 4C in the semiconductor chip 2D to one another. The fifth bonding wires 13 straddle over first bonding wires 9 and third bonding wires 11, but is connected to second bonding wires 10 at a second power supply pad 4, and thereby can reduce an inductance of the second reference potential.

The fourth bonding wires 12 and the fifth bonding wires 13 are wirings that extend in the X direction when viewed from the Z direction. Since wirings of these bonding wires can be thicker than wirings for the first reference potential and second reference potential circuits in the semiconductor memory chip 2, it is preferable based on a viewpoint of lowering the Q value of the power supply to reduce the inductance with the fourth bonding wires 12 and the fifth bonding wires 13.

Figure 3:
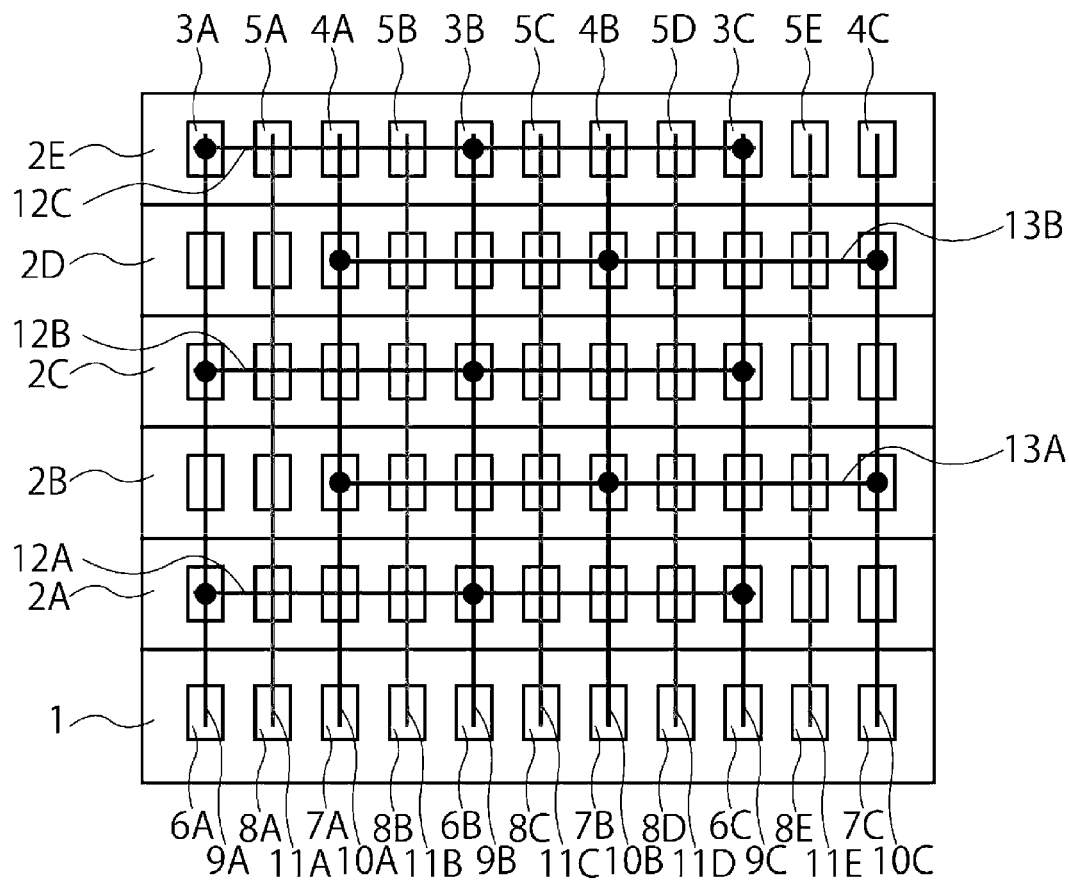
FIG. 3 is a conceptual wiring diagram of a semiconductor device according to an embodiment.

FIG. 3 is a conceptual diagram showing a wiring form of a semiconductor device 100. The vertically running wires (the first bonding wires 9, the second bonding wires 10, and the third bonding wires 11) are each directly connected to any pad with which they overlap. However, the horizontally running wires (the fourth bonding wires 12 and the fifth bonding wires 13) are directly connected to another bonding wire (or pad) with which they overlap only at the intersections indicated as black circles. For the fourth bonding wires 12, for the depicted intersections with another wire (or pad) for which there is no black circle, this indicates the fourth bonding wire 12 straddles over such wires (or pads). For example, the second bonding wires 10 and the third bonding wires 11 are not connected to any fourth bonding wires 12 in FIG. 3. Similarly, the fifth bonding wires 13, straddle the first bonding wires 9 and the third bonding wires 11 at intersections without a black circle. Subsequent FIGS. 6-9 make similar use of black circles to depict connective intersections.

Figure 4:
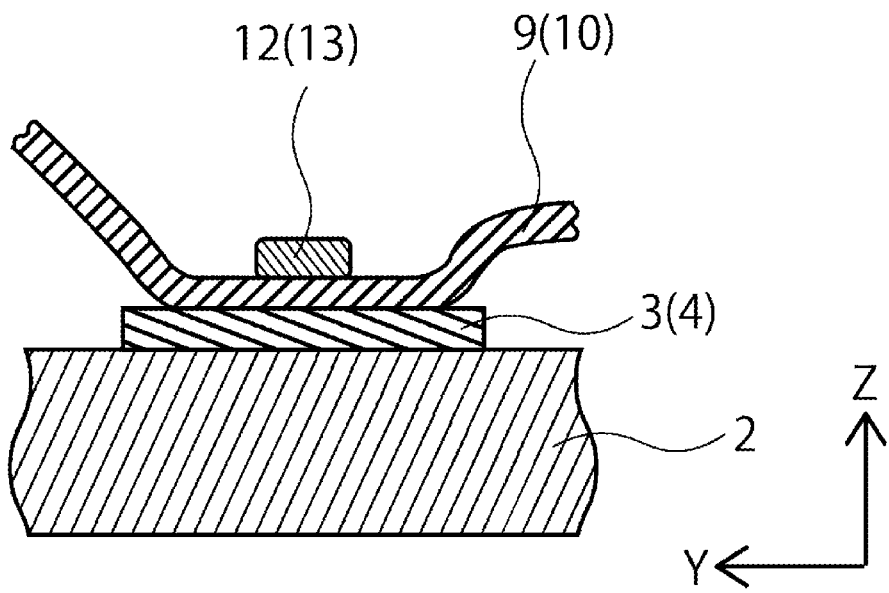
FIG. 4 is a conceptual diagram showing a wiring form of a semiconductor device according to an embodiment.

FIG. 4 shows an example of the wiring form of the semiconductor device 100 and is a conceptual diagram of a cross section that is perpendicular to the substrate 1 and is parallel to a direction in which the first bonding wires 9 extend. In this example, all the bonding wires (first to fifth) are formed by wedge bonding. There is a substantially flat surface (first upper surface) at a connection of the first bonding wire 9 formed on the first power supply pad 3 in the semiconductor memory chip 2 with the first power supply pad 3. The fourth bonding wire 12 is formed on this flat surface, and the first bonding wire 9 and the fourth bonding wire 12 are thus connected at the first upper surface. There is similarly a substantially flat surface (second upper surface) at a connection of the second bonding wire 10 formed on the second power supply pad 4 in the semiconductor memory chip 2 with the second power supply pad 4. The fifth bonding wire 13 is formed on this flat surface, and the second bonding wire 10 and the fifth bonding wire 13 are thus connected at the second upper surface.

Figure 5:
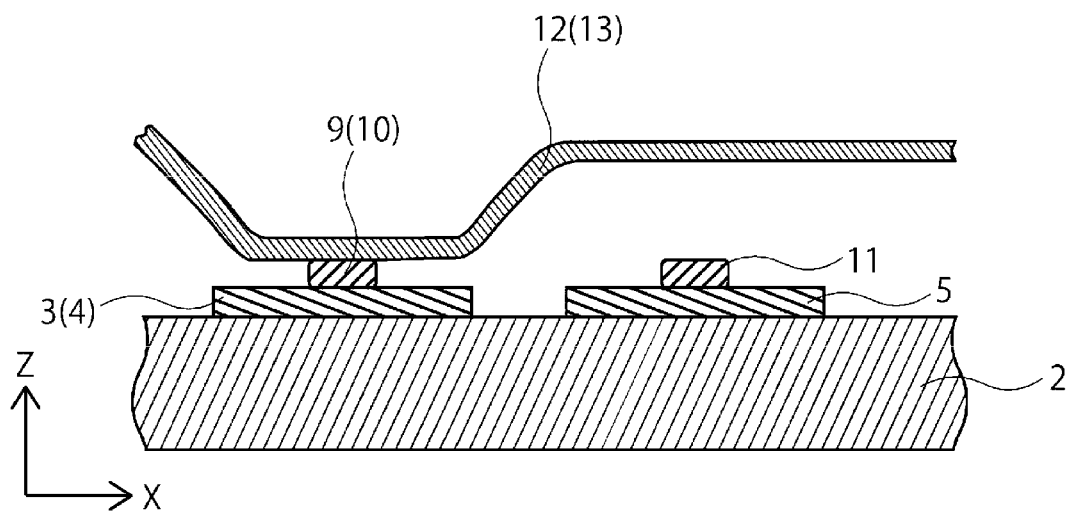
FIG. 5 is a conceptual diagram showing a wiring form of a semiconductor device according to an embodiment.

FIG. 5 is a conceptual diagram of a cross section that is perpendicular to the substrate 1 and is perpendicular to a direction in which the first bonding wires 9 extend. As shown in FIG. 5, the fourth bonding wire 12 is provided so as to bond to the flat surface on the first bonding wire 9 formed on the first power supply pad 3 in the semiconductor memory chip 2.

Based on a viewpoint of shortening the wiring length, it is preferable that the first bonding wire is sandwiched between the fourth bonding wire 12 and the first power supply pad 3, that is, the first bonding wire 9 is positioned between the first power supply pad 3 and the fourth bonding wire 12. If the first power supply pad 3 is enlarged to permit to the first bonding wire 9 and the fourth bonding wire 12 to be connected at different positions on the first power supply pad 3, the wiring length becomes longer by a distance between the first bonding wire 9 and the fourth bonding wire 12 on the first power supply pad 3. Based on the viewpoint of shortening the wiring length, it is preferable that the fourth bonding wire 12 is connected to the first bonding wire 9 without using a bump. By adopting a wiring that does not use a bump, the first bonding wire 9 is directly connected to the fourth bonding wire 12. By directly connecting the first bonding wire 9 to the fourth bonding wire 12, a wiring length via the fourth bonding wire 12 can be shortened.

When the fourth bonding wires 12 intersect the first bonding wires 9, three or more first bonding wires 9 can be connected by a single fourth bonding wire 12. For example, since the fourth bonding wire 12A is connected to the three first bonding wires 9, the first bonding wire 9B crosses the fourth bonding wire 12A on the first power supply pad 3B. By changing a length of the fourth bonding wire 12, it becomes possible to connect a large number of the first bonding wires 9 with a fourth bonding wire 12 without complicating a wiring structure, and the Q value of the power supply can be lowered efficiently.

In some examples, only one of the fourth bonding wire 12 and the fifth bonding wire 13 may be used. However, more preferably, both the fourth bonding wire 12 and the fifth bonding wire 13 are used. Since the third bonding wire 11 is a signal wiring, a bonding wire that spans between the adjacent third bonding wires 11 is not used.

Based on a viewpoint of shortening the wiring length, it is preferable that the second bonding wire is sandwiched between the fifth bonding wire 13 and the second power supply pad 4, that is, the second bonding wire 10 is positioned between the second power supply pad 4 and the fifth bonding wire 13. If the second power supply pad 4 is enlarged to permit to the second bonding wire 10 and the fifth bonding wire 13 to be connected at different positions on the second power supply pad 4, the wiring length becomes longer by a distance between the second bonding wire 10 and the fifth bonding wire 13 on the second power supply pad 4. Based on the viewpoint of shortening the wiring length, it is preferable that the fifth bonding wire 13 is connected to the second bonding wire 10 without using a bump. By adopting a wiring that does not use a bump, the first bonding wire 9 is directly connected to the fourth bonding wire 12. By directly connecting the first bonding wire 9 to the fourth bonding wire 12, the wiring length via the fourth bonding wire 12 can be shortened.

When the fifth bonding wires 13 intersect the second bonding wires 10, three or more second bonding wires 10 can be connected by a single fifth bonding wire 13. For example, since the fifth bonding wire 13A is connected to the three second bonding wires 10, the second bonding wire 10B crosses the fifth bonding wire 13A on the second power supply pad 4B. By changing a length of the fifth bonding wire 13, it becomes possible to connect a large number of the second bonding wires 10 with a fifth bonding wire 13 without complicating a wiring structure, and the Q value of the power supply can be lowered efficiently.

In some examples, only one of the fourth bonding wire 12 and the fifth bonding wire 13 may be used. However, more preferably, both the fourth bonding wire 12 and the fifth bonding wire 13 are used.

The controller chip 21 is a semiconductor chip configured to control reading, writing, and erasing of the semiconductor memory chips 2.

The sealing material 22 encapsulates the semiconductor memory chips 2, the first to fifth bonding wires 9 to 13, and the controller chip 21. The sealing material 22 is, for example, a molded resin.

The solder balls 23 are terminals that can be electrically connected to the outside of the semiconductor device 100.

By using a fourth bonding wire 12 or a fifth bonding wire 13 even at one place, the Q value of the power supply can be reduced and the power supply can be improved. By using the fourth bonding wires 12 and/or the fifth bonding wires 13 at a plurality of places, the Q value of the power supply can be further reduced and the power supply can be strengthened.

Since the impedance tends to increase on an upper stage side where the wiring is longest when the semiconductor memory chips 2 are provided in multiple stages, a fourth bonding wire 12 or/and a fifth bonding wire 13 on the upper stage side of the semiconductor memory chip 2 may be more beneficial in reducing impedance effects. However, it is more preferable to provide the fourth bonding wire 12 or/and the fifth bonding wire 13 for all semiconductor memory chips 2 of the plurality of semiconductor memory chips 2 in a stack or the like.

Second Embodiment

Figure 6:
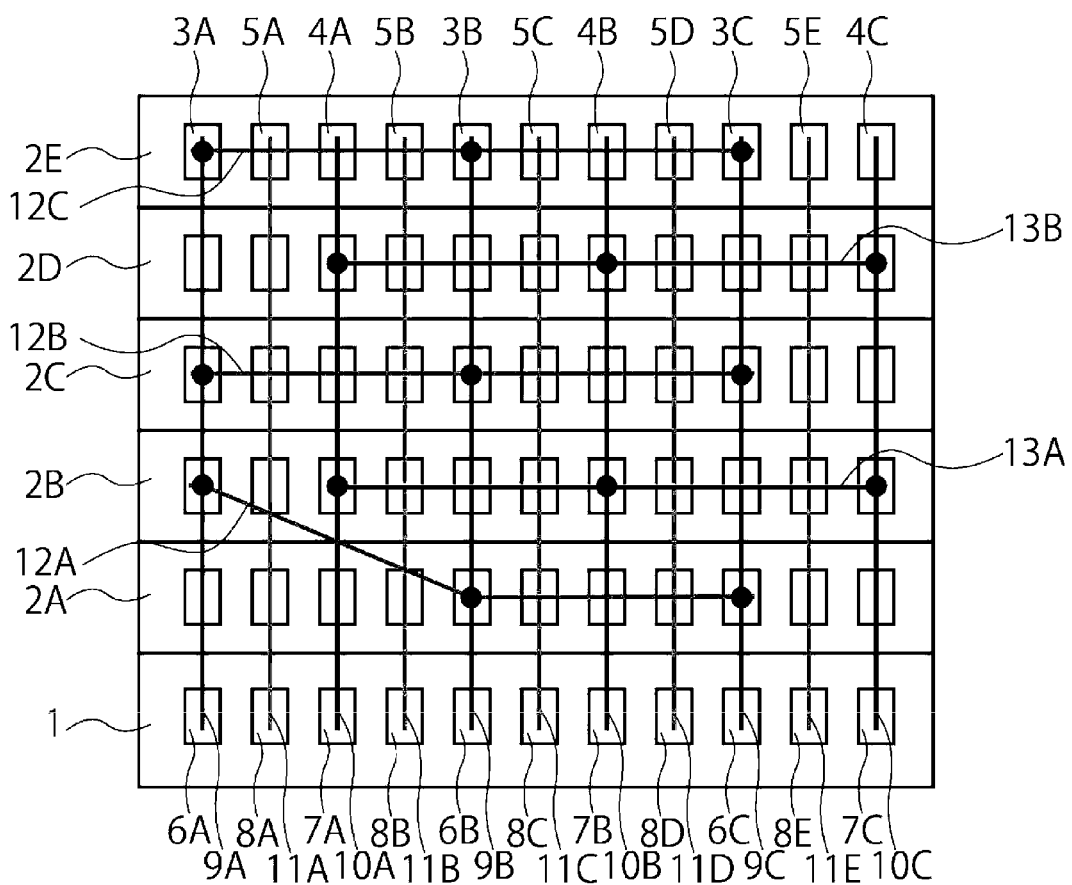
FIG. 6 is a conceptual wiring diagram of a semiconductor device according to an embodiment.

The second embodiment is a modification of the semiconductor device 100 according to the first embodiment. FIG. 6 is a conceptual diagram showing a wiring form of the semiconductor device according to the second embodiment. The semiconductor device 100 according to the second embodiment is different from the semiconductor device 100 according to the first embodiment in that the fourth bonding wires 12 are connected to the first power supply pads 3 of different semiconductor memory chips 2. Descriptions of contents common in the first embodiment and the second embodiment will be omitted.

In the second embodiment, a fourth bonding wire 12A connects to first power supply pad 3A in the semiconductor chip 2B, the power supply pad 3B in the semiconductor chip 2A, and the power supply pad 3C in the semiconductor chip 2A. In other words, different semiconductor chips 2 are connected by wirings running generally along the X direction. In this manner, a degree of freedom in the layout of the fourth bonding wires 12 and the fifth bonding wires 13 can be increased.

Similar to the fourth bonding wire 12, the fifth bonding wire 13 can also connect second power supply pads 4 of different semiconductor memory chips 2.

Third Embodiment

Figure 7:
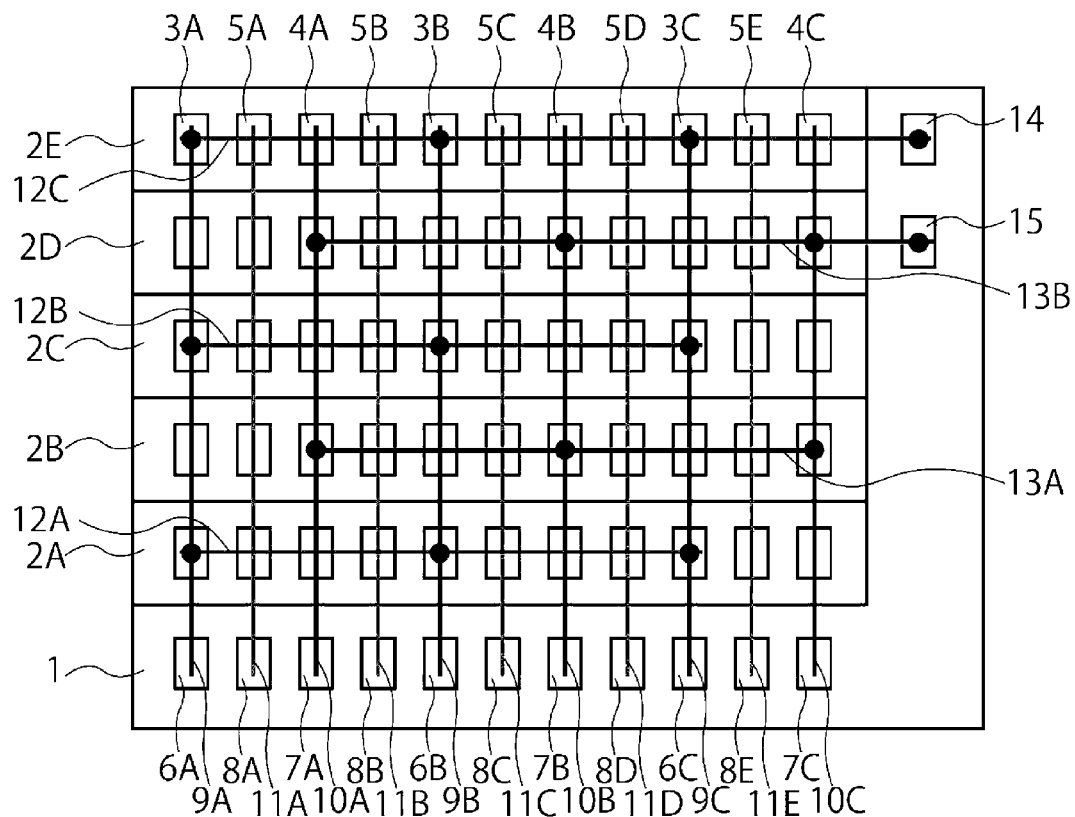
FIG. 7 is a conceptual wiring diagram of a semiconductor device according to an embodiment.

The third embodiment is a modification of the semiconductor device 100 according to the first embodiment. FIG. 7 is a conceptual diagram showing a wiring form of the semiconductor device according to the third embodiment. The semiconductor device 100 according to the third embodiment is different from the semiconductor device 100 according to the first embodiment in that the fourth bonding wire 12C is connected to the power supply pad 14 on the substrate 1 and the fifth bonding wire 13B is connected to the power supply pad 15 on the substrate 1. Descriptions of contents common in the first embodiment and the third embodiment will be omitted.

By connecting the fourth bonding wire 12C and the fifth bonding wire 13B to a power supply having a reference potential, the potential can be further stabilized. The power supply pad 14 has a first reference potential, and the power supply pad 15 has a second reference potential. For example, a more preferable configuration based on the viewpoint of lowering the Q value of the power supply is that, if the solder balls 23 (external terminals) for connection to a power supply having the first reference potential or the second reference potential are provided directly below or in a vicinity directly below the power supply pads 14, 15, the wiring length of the power supply wiring can be further shortened.

Fourth Embodiment

Figure 8:
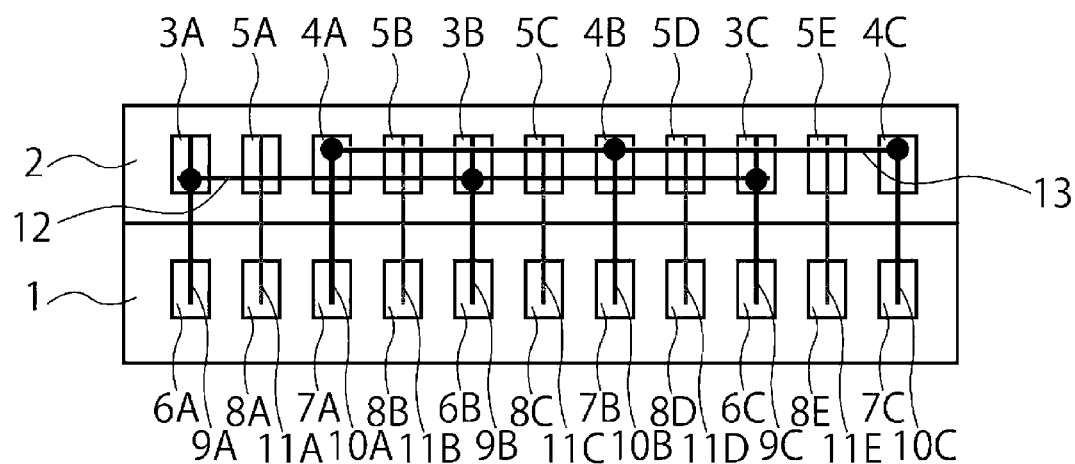
FIG. 8 is a conceptual wiring diagram of a semiconductor device according to an embodiment.

The fourth embodiment is a modification of the semiconductor device 100 according to the first embodiment. FIG. 8 is a conceptual diagram showing a wiring form of the semiconductor device 100 according to the fourth embodiment. The semiconductor device 100 according to the fourth embodiment is different from the semiconductor device 100 according to the first embodiment in that a fourth bonding wire 12 and a fifth bonding wire 13 run in parallel on the same semiconductor memory chip 2. Descriptions of contents common in the first embodiment and the fourth embodiment will be omitted.

The fourth bonding wire 12 and the fifth bonding wire 13 may both be provided in parallel on each semiconductor memory chip 2. By employing this configuration, the fourth bonding wire 12 and the fifth bonding wire 13 can be wired at high density, which contributes to a reduction in the Q value of the power supply. In the fourth embodiment, it is preferable to employ a wedge bonding capable of shortening the wiring length.

Also in a semiconductor device including a plurality of semiconductor memory chips 2, the fourth bonding wire 12 and the fifth bonding wire 13 can be provided in parallel.

Fifth Embodiment

Figure 9:
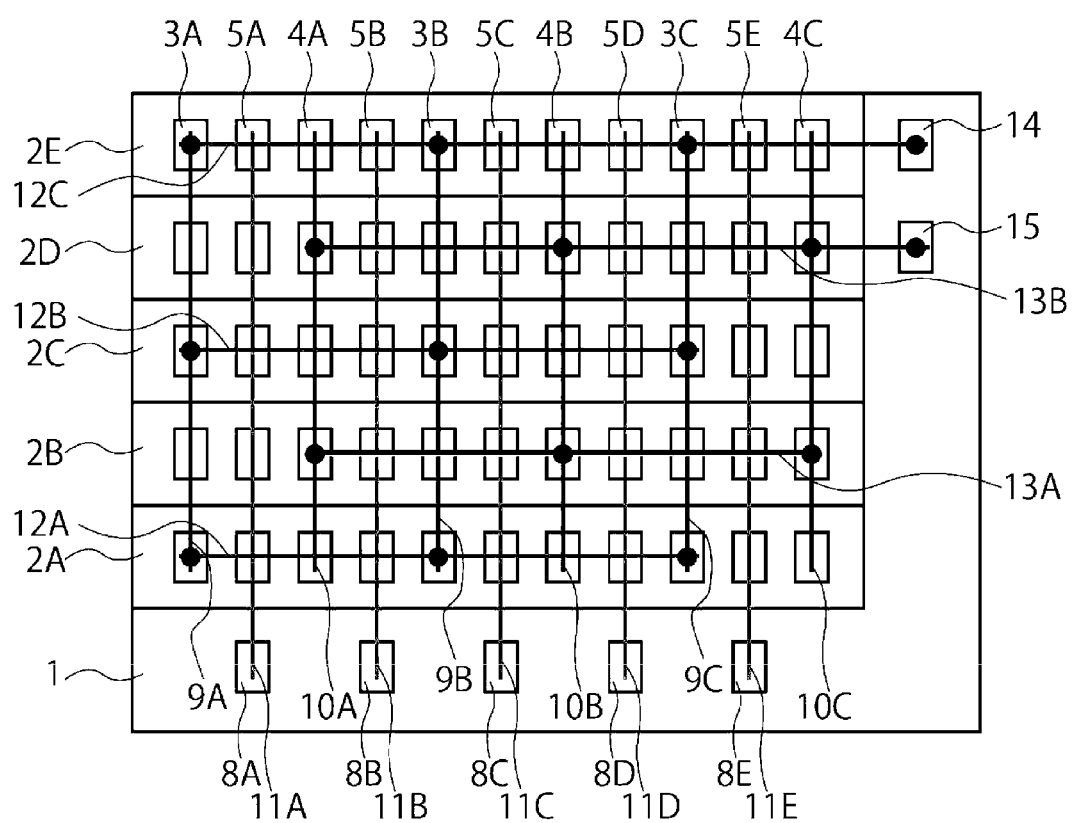
FIG. 9 is a conceptual wiring diagram of a semiconductor device according to an embodiment.

The fifth embodiment is a modification of the semiconductor device 100 according to the third embodiment. FIG. 9 is a conceptual diagram showing a wiring form of the semiconductor device according to the fifth embodiment. In the fifth embodiment, the power supply pads 6 and 7 between the signal pads 8 on the substrate 1 in the third embodiment are omitted. Descriptions of contents common in the third embodiment and the fifth embodiment will be omitted.

A return path can be eliminated by omitting the power supply pads 6 and 7 from being directly next to the signal pads 8 on the substrate 1. Since the inductance increases when a return path is present, the power supply can be further improved by adopting a configuration according to the fifth embodiment. Furthermore, the semiconductor device according to the fifth embodiment is preferable in that the wiring around the signal pads 8 on the substrate 1 is reduced and the freedom degree of the wiring is high.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first terminal on a substrate;
   a second terminal on the substrate;
   a plurality of third terminals on the substrate;
   a plurality of memory chips stacked on the substrate in an offset manner, each memory chip including first pads, second pads, and third pads;
   a first bonding wire that is electrically connected to the first terminal and physically connected to a first pad of different memory chips in the plurality;
   a second bonding wire that is electrically connected to the second terminal and physically connected to a second pad of the different memory chips;
   a third bonding wire that electrically connects one third terminal to a third pad of the different memory chips; and
   a fourth bonding wire connected to the first bonding wire at a first pad on a first memory chip in the plurality and another first pad on the first memory chip, the fourth bonding wire straddling over the second bonding wire connected to a second pad on the first memory chip and the third bonding wire connected to a third pad on the first memory chip.

2. The semiconductor device according to claim 1, further comprising:
a fifth bonding wire connected to the second bonding wire at a second pad on a second memory chip in the plurality and another second pad on the second memory chip, the fifth bonding wire straddling over the first bonding wire connected to a first pad on the second memory chip and the third bonding wire connected to a third pad on the second memory chip.

3. The semiconductor device according to claim 2, wherein
the first bonding wire has a flat first upper surface at a connection to the first pad on the first memory chip,
the fourth bonding wire is connected to the flat upper surface of the first bonding wire,
the second bonding wire has a flat upper surface at a connection to the second pad on the second memory chip, and
the fifth bonding wire is connected to the flat upper surface of the second bonding wire.

4. The semiconductor device according to claim 2, wherein
the first bonding wire is wedge bonded to the first pads of the different memory chips, and
the second bonding wire is wedge bonded to the second pads of the different memory chips.

5. The semiconductor device according to claim 1, wherein
the first bonding wire has a flat upper surface at a connection to the first pads of the different memory chip, and
the fourth bonding wire is connected to the flat upper surface of the first bonding wire at the first pad of the first memory chip.

6. The semiconductor device according to claim 1, wherein
the first bonding wire is wedge bonded to the first pads of the different memory chips,
the second bonding wire is wedge bonded to the second pads of the different memory chips, and
the third bonding wire is wedge bonded to the third pads of the different memory chips.

7. The semiconductor device according to claim 1, wherein the first, second, and third terminals are on the same side of the plurality of memory chips and aligned in a row that is parallel to an edge of a memory chip in the plurality.

8. The semiconductor device according to claim 7, further comprising:
a fourth terminal on the substrate, the fourth bonding wiring being connected to the fourth terminal.

9. The semiconductor device according to claim 8, wherein the fourth terminal is on a side of the plurality of memory chips that is different from the first, second, and third terminals.

10. The semiconductor device according to claim 1, wherein
the fourth bonding wire is physically connected to the first terminal, and
the first bonding wire is electrically connected to the first terminal through fourth bonding wire.

11. A semiconductor device, comprising:
a first terminal on a substrate;
a second terminal on the substrate;
a plurality of third terminals on the substrate;
a stack of memory chips on the substrate, the memory chips stacked in an offset manner from one another, each memory chip having, on a portion of the respective memory chips left uncovered by other memory chips in the stack, a plurality of first pads, a plurality of second pads, and a plurality of third pads;
a plurality of first bonding wires, each electrically connected to the first terminal and physically connected to a first pad of each of the memory chips in the stack;
a plurality of second bonding wires, each electrically connected to the second terminal and physically connected to a second pad of each of the memory chips in the stack;
a plurality of third bonding wires, each being electrically connected to one third terminal of the plurality of third terminals and physically connected a third pad of each of the memory chips in the stack; and
a fourth bonding wire connected to the first bonding wires at each first pad on a first memory chip in the stack, the fourth bonding wire straddling over at least one second bonding wire connected to a second pad on the first memory chip and at least one third bonding wire connected to a third pad on the first memory chip.

12. The semiconductor device according to claim 11, further comprising:
a fifth bonding wire connected to the second bonding wires at each second pad on a second memory chip in the stack, the fifth bonding wire straddling over the at least one first bonding wire connected to a first pad on the second memory chip and at least one third bonding wire connected to a third pad on the second memory chip.

13. The semiconductor device according to claim 12, wherein
the first bonding wires are wedge bonded to the first pads, and
the second bonding wires are wedge bonded to the second pads.

14. The semiconductor device according to claim 11, wherein
the first bonding wires have a flat upper surface at a connection to the first pads, and
the fourth bonding wires are connected to the flat upper surface of the first bonding wires.

15. The semiconductor device according to claim 11, wherein
the first bonding wires are wedge bonded to the first pads,
the second bonding wires are wedge bonded to the second pads, and
the third bonding wires are wedge bonded to the third pads.

16. The semiconductor device according to claim 11, wherein the first, second, and third terminals are on the same side of the memory chips in the stack and aligned in a row that is parallel to an edge of the memory chips in the stack.

17. The semiconductor device according to claim 16, further comprising:
a fourth terminal on the substrate, the fourth bonding wiring being connected to the fourth terminal.

18. The semiconductor device according to claim 17, wherein the fourth terminal is on a side of the memory chips in the stack that is different from the first, second, and third terminals.

19. The semiconductor device according to claim 11, wherein
the fourth bonding wire is physically connected to the first terminal, and the first bonding wire is electrically connected to the first terminal through fourth bonding wire.

20. The semiconductor device according to claim 11, further comprising:
a fifth bonding wire connected to the second bonding wires at each second pad on the first memory chip, the fifth bonding wire straddling over the at least one first bonding wire and at least one third bonding wire connected to a third pad on the second memory chip, wherein
the fourth and fifth bonding wire run in parallel to each other along the portion of the first memory chip left uncovered by other memory chips.

\* \* \* \* \*